United States Patent [19]

Cave et al.

[11] 4,207,537
[45] Jun. 10, 1980

[54] DIFFERENTIAL FIELD EFFECT TRANSISTOR AMPLIFIER HAVING A COMPENSATING FIELD EFFECT TRANSISTOR CURRENT SOURCE

[75] Inventors: David L. Cave, Phoenix; Wilson D. Pace, Tempe, both of Ariz.

[73] Assignee: Motorola, Inc., Schaumburg, Ill.

[21] Appl. No.: 925,083

[22] Filed: Jul. 17, 1978

[51] Int. Cl.² ..................... H03F 3/16; H03F 3/45
[52] U.S. Cl. .................... 330/253; 330/256; 330/257; 330/288
[58] Field of Search ............ 330/253, 256, 257, 277, 330/288, 307

[56] References Cited

U.S. PATENT DOCUMENTS

4,053,915  10/1977  Cave .................... 357/22

OTHER PUBLICATIONS

Sakai et al. "Complementary Power Fets with Vertical Structures" *Nec. Research and Development* Nos. 37–38, pp. 65–73, Apr.–Jul. 1975.

*Electronic Design 4*, vol. 21, No. 4, Feb. 15, 1973 p. A9.

*Primary Examiner*—James B. Mullins
*Attorney, Agent, or Firm*—Maurice J. Jones, Jr.

[57] ABSTRACT

An amplifier circuit is disclosed which includes a current supply circuit having a field effect transistor and negative feedback for degenerating the magnitude of the current supplied thereby. The negative feedback can be provided by a diffused resistor connected between the gate and source electrodes of the current supply field effect transistor. A differential amplifier which includes a pair of differentially coupled amplifying field effect transistors is coupled to the current supply circuit. The negative feedback enables the current supply device to provide a current which compensates the differentially coupled field effect transistors over processing while not deleteriously affecting the temperature characteristics thereof. A bipolar diode and a bipolar transistor can be included in the current supply for enabling the resistor to take up less chip area and for allowing more flexibility in the design of the geometry of the current supply, field effect transistor.

11 Claims, 4 Drawing Figures

DIFFERENTIAL FIELD EFFECT TRANSISTOR AMPLIFIER HAVING A COMPENSATING FIELD EFFECT TRANSISTOR CURRENT SOURCE

BACKGROUND OF THE INVENTION

Many types of present-day circuits utilize differentially connected field effect transistors (FETs). More particularly, operational amplifiers now include differential field effect transistor input stages and bipolar output stages. The FET input stages provide advantages with respect to differential bipolar transistor input stages such as higher input impedance. Unfortunately, the electrical parameters of a differential pair of field effect transistors varies with temperature. Also the electrical parameters of differential pairs of field effect transistors varies from circuit to circuit because of processing variations.

More particularly, the unity gain bandwidth of such field effect differential pairs is a function of the transconductance thereof which varies with the pinch-off voltage ($V_p$), the drain-to-source current ($I_{DS}$), and the saturation current ($I_{DSS}$) thereof. Since the pinch-off voltage and the saturation current are functions of temperature, prior art circuits including differential field effect pairs have utilized bipolar current sources which generate drain-to-source currents having a predetermined temperature co-efficient which compensates somewhat for the temperature coefficients of the pinch-off voltages and the saturation currents of the differential FETs. One such prior art bipolar current source circuit includes a zener diode, a plurality of diodes and a PNP transistor, for instance. Accordingly, this bipolar current source or supply circuit takes up an undesirable amount of the chip area of an integrated circuit thereby increasing costs and reducing reliability.

The saturation current and the pinch-off voltage of the differential field effect transistors are also a function of process variations. Since such field effect transistors are manufactured by a process such as ion implantation which is generally independent of the bipolar process utilized to fabricate bipolar diodes and bipolar transistors, the bipolar current supply does not develop a current which compensates for the changes in these electrical parameters of the field effect transistors over processing. As a result, the transconductance and thus the bandwidth of such field effect transistor differential amplifiers having bipolar current supplies varies undesirably with process variations which results in substantially reduced yield and increased costs. More specifically, if the actual bandwidth of some high frequency, integrated circuit amplifiers having a desired bandwidth of 5 MHz is below 4 MHz, the amplifiers are unsuitable for high frequency amplification. Also, if the actual bandwidth is above 6 MHz, such amplifiers tend to oscillate because of internal phase shifts.

A field effect transistor having the gate thereof connected to the source thereof has been suggested for providing a drive current which varies in such a manner as to compensate for the changes in pinch-off voltage and saturation current over the processing of the differential FET pair. However, this current supply provides a drain-to-source current having a temperature coefficient which aggravates rather than compensates for the change in pinch-off voltage and saturation current over temperature of the differential FET pair. Consequently, this field effect transistor current supply is unsuitable for use with differential FET pairs because the temperature specifications of such circuits is critical.

Thus, the semiconductor industry generally has chosen to utilize the complex bipolar current supplies which decrease yields rather than FET current supplies which fail to meet temperature specifications.

A degenerated or negative feedback, field effect transistor current supply is disclosed by U.S. Pat. No. 4,053,915, entitled, "Temperature Compensated Constant Current Source Device," (Ser. No. 669,065) which was invented by one of the inventors hereof and assigned to the assignee hereof. This current supply utilizes negative feedback and can be designed to provide a current of substantially zero temperature coefficient for use with bipolar transistor differential amplifiers which require such a current. This supply has heretofore been believed to be unsuitable for use with FET differential pairs which, as previously mentioned, have been believed to require a bipolar current supply for providing a current having a temperature coefficient which compensates for the change of saturation current and pinch-off voltage of the differential FETs with temperature. Such negative feedback current source, although suitable for many applications involving bipolar transistors, has the further disadvantage of requiring a source resistor, which sometimes takes up an undesirable amount of chip surface area, and the configuration of the negative feedback current supply provides only limited flexibility in the choice of the geometry of the FET used therein.

SUMMARY OF THE INVENTION

One object of the present invention is to provide an amplifier having a current source or supply which is suitable for providing drain-to-source currents to the commonly connected sources of differential field effect transistors.

Another object of the invention is to provide an amplifier having a current source or supply which develops a drain-to-source current for differentially connected field effect transistor pairs that compensates for the changes in pinch-off voltage and saturation current of the pair over processing without deleteriously reacting with the temperature coefficients of the pinch-off voltage and saturation current of the differential field effect transistor pairs over temperature.

Still another object of the invention is to provide a current supply circuit for use with differential field effect amplifiers which has a simple configuration, takes up a minimum amount of surface area of an integrated circuit and allows flexibility in the geometry of the FET used therein.

A further object of the invention is to provide a current supply circuit suitable for simultaneously driving and compensating a plurality of differential field effect transistor pairs over process variations.

In brief, an amplifier circuit in accordance with the present invention includes a current supply circuit having a current supply, field effect transistor with control and main electrodes and a negative feedback circuit coupled to the current supply field effect device for degenerating the magnitude of the current supplied thereby. A differential amplifier including a pair of differentially coupled amplifying field effect devices is coupled to the current supply field effect device. The negative feedback circuit can include a resistive element coupled between the source and the gate electrodes of the current supply field effect transistor.

Furthermore, the current supply circuit can include a bipolar diode and a bipolar transistor. The bipolar diode has one electrode coupled to the drain electrode of the current supply field effect device and another electrode coupled to a supply terminal. The bipolar transistor has a control electrode coupled to the drain electrode of the current supply field effect device, one main electrode coupled to the source electrode of the current supply field effect device and another main electrode coupled to the supply terminal. An output current, which compensates for changes in the electrical parameters of the differentially coupled amplifying field effect devices over processing variations, is provided at an output node connected to the control electrode of the bipolar transistor and to the diode.

DETAILED DESCRIPTION OF THE PREFERRED EMBODIMENTS

Figure 1:
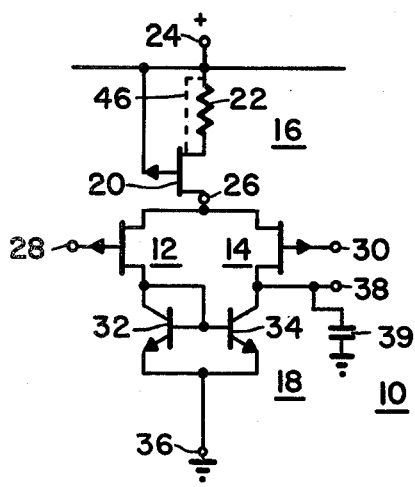
FIG. 1 is a schematic diagram of a differential amplifier having a pair of differentially connected field effect transistors, a negative feedback field effect transistor current supply, and a bipolar differential-to-single ended converter circuit.

FIG. 1 is a schematic diagram of differential amplifier 10 which includes a pair of differentially connected, P-channel junction devices or FETs 12 and 14, a degenerative or negative feedback current supply circuit 16 and a bipolar differential-to-single ended converter circuit 18. The degenerated current source or supply 16 also includes a P-channel junction FET 20 having a source electrode connected through a negative feedback resistor 22 to a terminal 24 which is adapted to provide a positive supply potential. FET 20 also has a gate electrode connected to terminal 24 and a drain electrode connected to terminal 26. The drain and source electrodes are defined as being the main electrodes and the gate electrode is defined as being the control electrode of each of the FETs.

The commonly-connected source electrodes of FETs 12 and 14 are connected through terminal 26 to the drain electrode of FET 20. The gate electrodes of transistors 12 and 14 are respectively connected to differential input terminals 28 and 30. The collector electrodes of NPN differential-to-single ended converter, bipolar transistors 32 and 34 are respectively connected to the drain electrodes of transistors 12 and 14, which provide a differential output. The base electrode of transistor 32 is connected to the collector electrode thereof to form a diode-connected transistor in a manner well known in the art. The base electrode of transistor 32 is connected to the base electrode of transistor 34 and the emitter electrodes of transistors 32 and 34 are connected together and to negative potential terminal 36. The collector electrode of transistor 34 and the drain electrode of transistor 14 are connected to single-ended output terminal 38 of differential amplifier 10. Capacitor 39, which is connected to terminal 38, represents the capacitance of input stage 10.

The unity gain bandwidth of amplifier 10 is given by:

$$\omega = gm/C \tag{1}$$

where
gm is the transconductance of FETs 12 and 14; and
C is the capacitance of capacitor 39 of the input stage.
The transconductance of FETs 12 and 14 in combination with differential-to-single ended converter 18 is given by the following equation:

$$gm = \frac{2\sqrt{I_{DS} \times I_{DSS}}}{V_P} \tag{2}$$

where
$I_{DS}$ is the drain-to-source current;
$I_{DSS}$ is the saturation current; and
$V_P$ is the pinch-off voltage of the FETs.

Both the pinch-off voltage and the saturation current of equation (2) vary both with temperature and process. At worst case, these effects can be cumulative on transconductance and hence on bandwidth. Consequently, it is desirable for the magnitude of the current delivered by the current supply to terminal 26 to also change over process and temperature in such a manner as to compensate for the changes of the saturation current and the pinch-off voltage to keep gm as constant as practicable so that the bandwidth of the amplifier is determined.

Figure 2:
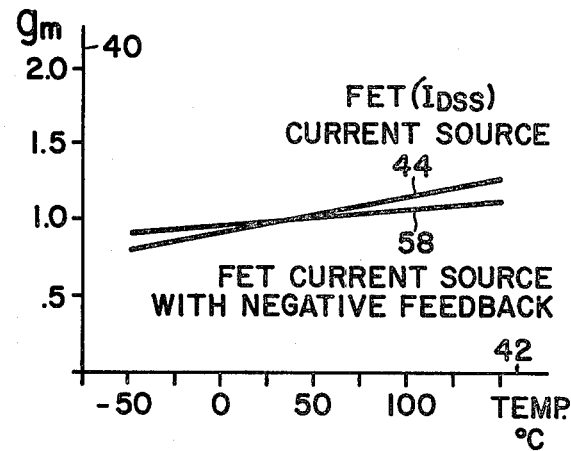
FIG. 2 is a graph of transconductance versus temperature for the differential pair of FETs of FIG. 1 illustrating the improvement of the negative feedback FET current supply as compared to a non-degenerated FET current supply.

FIG. 2 is a graph of transconductance along ordinate axis 40 versus temperature along abscissa axis 42. Line 44 indicates the relationship between transconductance and temperature over a range of between −50° C. and +125° C. for a non-degenerated field effect transistor current supply which is formed by removing resistor 22 from FIG. 1 and substituting a conductor 46 therefor as shown in dashed form. The resulting current source provides a current of a magnitude of ($I_{DSS}$). The use of an undegenerated field effect transistor results in a worst case variation in gm of from between +25% and −25% which causes the unity gain bandwidth of a 5 MHz amplifier to vary from between 6.25 MHz and 3.75 MHz, for instance. This is because the temperature coefficient of the drain-to-source current supplied by such a FET current source does not track or compensate for the changes in both the pinch-off voltage and the saturation current of differential FET pair 12, 14 over temperature. The temperature coefficient of the drain-to-source current of the uncompensated field effect transistor is of such a nature as to aggravate rather than compensate for the effects of these temperature coefficients on the transconductance. Selection by testing does not solve this problem. Thus, it has been natural and necessary for the designers and hence for the integrated circuit industry to not utilize field effect transistors as current sources for supplying differential pairs of field effect transistors when performance over a wide temperature range is necessary. Accordingly, various arrangements of bipolar transistor current supplies have been designed and used with differential FETs which provide a fairly flat gm versus temperature curve over the temperature range between −50° C. and +125° C.

Figure 3:
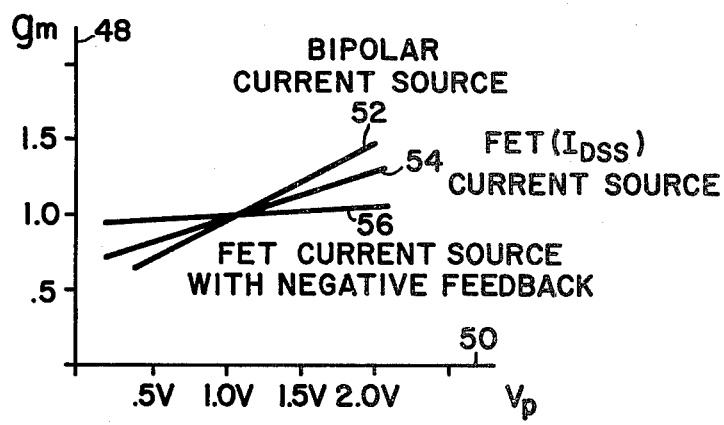
FIG. 3 is a graph of transconductance versus pinch-off voltage illustrating the improvement of the negative feedback field effect transistor current supply as compared to both a non-degenerated FET current supply and a bipolar current supply.

Referring now to FIG. 3, transconductance is plotted along ordinate axis 48 and pinch-off voltage is plotted along abscissa axis 50. Over process variation, the normal distribution of pinch-off voltage, for one particular linear integrated circuit line, is nominally from between 0.5 to 1.5 volts. This results in a worst case change of gm of from between +50% to −50% for the bipolar current source which causes the unity gain bandwidth of a 5 MHz amplifier to vary from between 2.5 MHz and 7.5 MHz.

Line 52 shows the relationship between the transconductance and the pinch-off voltage for a particular simple, prior art bipolar current source which includes a PNP transistor having the base-to-emitter junction thereof shunted by a diode. The emitter electrode is also connected to receive a positive supply potential, the base electrode is connected to receive a negative supply potential and the collector electrode of the transistor provides the drain-to-source current for the differential pair. Even though the transconductance of such an amplifier varies considerably over the range of pinch-off voltages provided by a carefully controlled ion implantation process, some of the FET devices will have acceptable pinch-off voltages thereby enabling the amplifier to have acceptable transconductances. These amplifiers can be chosen by selective testing. Even though the variation of transconductance over the range of pinch-off voltages results in lowering the yield and thereby increasing the cost of the accepted devices, the industry is utilizing bipolar current sources for driving differential FET pairs.

Line 54 of FIG. 3 indicates the transconductance versus pinch-off voltage characteristic for a non-degenerated FET current source. As can be seen, the transconductance does not vary as much over the deviation of pinch-off voltages using this approach, thus resulting in higher yields and lower costs. Unfortunately, as previously pointed out, such current sources do not meet the temperature specification and therefore are unuseable in applications requiring typical temperature ranges of between −50° C. and +125° C., for example.

Line 56 of FIG. 3 shows the relationship between transconductance over pinch-off voltage with process for a degenerated FET current source 16 illustrated in FIG. 1. From line 56 it can be seen that the worst case deviation in gm over the nominal range of pinch-off voltages of 0.5 v to 1.5 v is only between +7% and −7% which results in the unity gain bandwidth changing from 5.35 MHz to 4.65 MHz. Current supply 16 also compensates for the undesirable change in $I_{DSS}$ of FETs 12 and 14 over processing.

Figure 4:
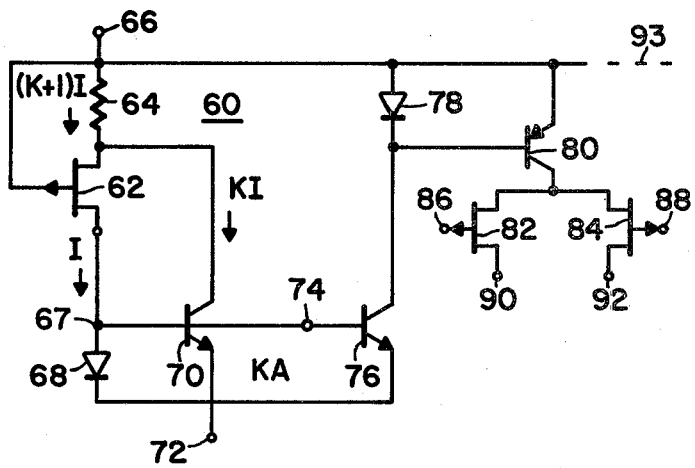
FIG. 4 is a schematic diagram of a further improved negative feedback field effect transistor current supply for supplying a current to one or a plurality of differential FET pairs and compensating it or them over process.

As explained in the aforementioned U.S. Pat. No. 4,053,915, resistor 22 may be a diffused type resistor made of the P-type diffusion region in series with the source of FET 26. The resistivity and temperature coefficient of resistor 22 are restrained by the particular process of semiconductor manufacture. In some applications, the configuration of circuit 16 causes resistor 22 to take up an undesirable amount of surface area of the die and/or to have an undesirable effect on the geometry of FET 20. The circuit configuration of current supply 60 of FIG. 4 generally solves these problems.

More specifically, FET current supply 60 includes FET 62 having a source electrode connected through resistor 64 to positive potential supply terminal 66. FET 62 further has a gate electrode directly connected to terminal 66 and a drain electrode connected through node 67 to the anode electrode of diode 68. The source electrode of FET 62 is also connected to the collector electrode of transistor 70. The cathode electrode of diode 68 and the emitter electrode of NPN transistor 70 are connected to negative potential supply terminal 72. The anode of diode 68 is also connected through node 67 to the base electrode of transistor 70 and to current supply output terminal 74.

The emitter-to-base junction cross-sectional area of transistor 70 is greater than the anode-to-cathode junction cross-sectional area of diode 68 by a factor of "K." The anode-to-cathode current of diode 68 (I) and the emitter current of transistors 70 (KI) are respectively proportional to the junction cross-sectional areas of anode-to-cathode and base-to-emitter thereof. Basically, transistor 70 enables resistor 64 to have a lower value for a given bias current than resistor 22 of FIG. 1. Transistor 70 reduces the value of resistor 64 by 1/(K+1) for substantially identical circuit performance. Transistor 70 further increases the flexibility in the choice of the width-to-length ratio of FET 62.

In operation, transistor 70 senses the voltage across diode 68 caused by the current of magnitude "I" and provides a current through the collector-to-emitter path thereof having a magnitude of "KI." As a result, the current through resistor 64 has a magnitude of (K+1) I. Hence, by adjusting the factor K or the base-to-emitter junction cross-section area of transistor 70, the apparent value of resistor 64 is controlled, resulting in resistor 64 taking up less surface area and providing more flexibility for the geometry of FET 62, while still providing the appropriate bias current for FET 62.

NPN current mirror transistor 76 has a base electrode connected to output terminal 74, an emitter electrode connected to negative supply terminal 72 and a collector connected to the cathode electrode of diode 78. PNP transistor 80 has a base electrode which is also connected to the cathode of the diode 78, an emitter electrode connected to positive supply terminal 66 and a collector electrode connected to the common source electrodes of differentially connected FETs 82 and 84. The anode of diode 78 is connected to positive supply terminal 66. The gate electrodes of FET devices 82 and 84 are respectively connected to differential input terminals 86 and 88 and the drain electrodes of FETs 82 and 84 are respectively connected to output terminals 90 and 92. A plurality of PNP transistor and differential FET pair combinations can be connected between terminals 66 and 72 by repeating the configuration of PNP transistor 80 and FET pairs 82 and 84 in order to provide quad operational amplifiers, as indicated by dashed line 93. Transistor 76 is responsive to the current at output terminal 74 to control the current through diode 78 and hence cause the collector current of transistor 80 to be the desired function of temperature and processing for compensating either one or a plurality of pairs of FET transistors 82 and 84.

Thus, what has been described are amplifiers including current sources or supplies 16 and 60 which are suitable for providing drain-to-source currents to the commonly-connected sources of differential FET pairs 12, 14 and 82, 84, respectively. The drain-to-source current compensates for the change in pinch-off voltage and saturation current of the FET pairs over processing without deleteriously effecting the pinch-off voltage and saturation current of the differential pairs over temperature. Both configurations are simple, reliable and take up a minimum amount of surface area of an integrated circuit. Current supply 60 allows flexibility in the geometry of FET 62 used therewith and enables resistor 64 to have a small geometry. Current source 60 is suitable for simultaneously driving and compensating a plurality of differential field effect transistor pairs in the manner previously described.

While the invention has been described in its preferred embodiments, it is to be understood that the words which have been used are words of description rather than limitation, and that changes within the purview of the appended claims may be made without departing from the true scope and spirit of the invention in its broadest aspects.

What is claimed is:

1. An amplifier circuit including in combination:
   a current supply circuit having a current supply field effect device with gate, source and drain electrodes and negative feedback means coupled to said current supply field effect device for degenerating the magnitude of the current supplied thereby, said current supply circuit further including bipolar diode means having one electrode coupled to said drain electrode of said current supply field effect device and another electrode of said bipolar diode means being coupled to a supply terminal; and bipolar transistor means having a pair of main electrodes and a control electrode, said control electrode of said bipolar transistor means being coupled through a circuit node to said one electrode of said bipolar diode means and to said drain electrode of said current supply field effect device, one said main electrode of said bipolar transistor means being coupled to said source electrode of said current supply field effect device, and another said main electrode of said bipolar transistor means being coupled to said supply terminal, an output current for at least partially compensating for changes in the electrical parameters of a pair of differentially coupled field effect devices over process variations being provided from said circuit node;
   differential amplifier means including a pair of differentially coupled field effect devices; and
   circuit means coupling said current supply circuit to said differentially coupled field effect devices.

2. The amplifier circuit of claim 1 wherein said current supplying field effect device and said differentially coupled field effect devices include field effect transistors included in a single monolithic integrated circuit.

3. The amplifier circuit of claim 1 wherein said negative feedback means includes resistive means coupled to said source electrode of said current supply field effect device.

4. The amplifier circuit of claim 3 wherein said resistive means includes a diffused semiconductor resistor formed integrally with said source electrode of said current supply field effect device, said current supply field effect device having a temperature coefficient, said diffused semiconductor resistor having a predetermined temperature coefficient so that said temperature coefficients of said current supply field effect device and said semiconductor resistor are self-compensating to cause the current through said current supply field effect device to have a magnitude which is substantially independent of temperature variations.

5. The amplifier circuit of claim 1 wherein:
   said differentially coupled field effect devices include source electrodes which are connected together, drain electrodes which are coupled to output terminals of the amplifier circuit, and gate electrodes which provide input terminals of the amplifier circuit; and
   said circuit means connects said source electrodes of said differentially coupled field effect devices to said drain electrode of said current supply field effect device.

6. The amplifier circuit of claim 5 further including a bipolar differential-to-single ended converter connected to said drain electrodes of said differentially coupled field effect devices.

7. The amplifier circuit of claim 1 wherein said circuit means includes a current mirror circuit.

8. An amplifier circuit including in combination:
   current supply field effect transistor means having source, drain and gate electrodes;
   negative feedback means coupled to said source electrode;
   bipolar diode means having one electrode connected to said drain electrode and another electrode connected to a supply terminal;
   bipolar transistor means having a control electrode and main electrodes, said control electrode being coupled to said drain electrode and to said one electrode of said bipolar diode means at a circuit node, said main electrodes being connected between said source electrode and said supply terminal, said circuit node providing an output current;
   circuit means coupled to said circuit node; and
   differentially connected field effect devices having commonly-connected source electrodes coupled to said circuit means.

9. The current supply circuit of claim 8 wherein said negative feedback means includes a diffused semiconductor resistor formed integrally with said source electrode of said current supply field effect device, said current supply field effect device having a temperature coefficient, said diffused semiconductor resistor having a predetermined temperature coefficient so that said temperature coefficients of said current supply field effect device and said semiconductor resistor are self-compensating to cause the current through said current supply field effect device to have a magnitude which is substantially independent of temperature variations.

10. The current supply circuit of claim 8 wherein said current supply field effect transistor means and said differentially connected field effect devices are P-channel junction field effect transistors included in a single monolithic integrated circuit.

11. The amplifier circuit of claim 8 wherein said circuit means includes a current mirror.

* * * * *